(12) United States Patent
Hofmann et al.

(10) Patent No.: US 6,242,319 B1
(45) Date of Patent: Jun. 5, 2001

(54) METHOD FOR FABRICATING AN INTEGRATED CIRCUIT CONFIGURATION

(75) Inventors: Franz Hofmann, München; Josef Willer, Riemerling, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/498,530

(22) Filed: Feb. 4, 2000

(30) Foreign Application Priority Data

Feb. 4, 1999 (DE) .............................................. 199 04 571

(51) Int. Cl.[7] .......................... H01L 21/76; H01L 21/30; H01L 21/46
(52) U.S. Cl. .......................... 438/401; 438/406; 438/455; 438/456
(58) Field of Search ..................................... 438/401, 406, 438/455, 456, 462, 942, 945, 947, 949

(56) References Cited

U.S. PATENT DOCUMENTS

| | | | |
|---|---|---|---|
| 4,351,892 | * 9/1982 | Davis | 430/30 |
| 4,632,724 | * 12/1986 | Chesebro et al. | 156/626 |
| 4,992,394 | * 2/1991 | Kostelak, Jr. et al. | 437/229 |
| 5,087,585 | * 2/1992 | Hayashi | 437/51 |
| 5,843,831 | * 12/1998 | Chung et al. | 438/401 |
| 5,893,744 | * 4/1999 | Wang | 438/401 |
| 6,008,060 | * 12/1999 | Chang et al. | 438/7 |

OTHER PUBLICATIONS

Japanese Patent Abstract No. 4–283956 (Tahima), dated Oct. 8, 1992.
"Fabrication of Three–Dimensional IC Using 'Cumulatively Bonded IC' (CUBIC) Technology", Y. Hayashi et al., 1990 Symposium on VLSI Technology, pp. 95–96.

* cited by examiner

*Primary Examiner*—Matthew Smith
*Assistant Examiner*—Lex H. Malsawma
(74) *Attorney, Agent, or Firm*—Herbert L. Lerner; Laurence A. Greenberg; Werner H. Stemer

(57) ABSTRACT

A first structure of a circuit configuration and a first alignment structure are produced in the region of a surface of a first substrate. The first alignment structure scatters electron beams differently than its surroundings. A second substrate, which is more transmissive to electron beams than the first alignment structure, is connected to the first substrate in such a way that the second substrate is disposed above the surface of the first substrate. In order to align a mask with respect to the first structure, a position of the first alignment structure is determined with the aid of electron beams. With the aid of the mask, at least one second structure of the circuit configuration is produced in the region of an uncovered upper surface of the second substrate. The first structure may be a metallic line encapsulated by insulating material. A contact may connect the first structure to the second structure. With the aid of electron beam lithography, at least one second alignment structure may be produced in the region of the upper surface of the second substrate, using which the mask is aligned.

10 Claims, 2 Drawing Sheets

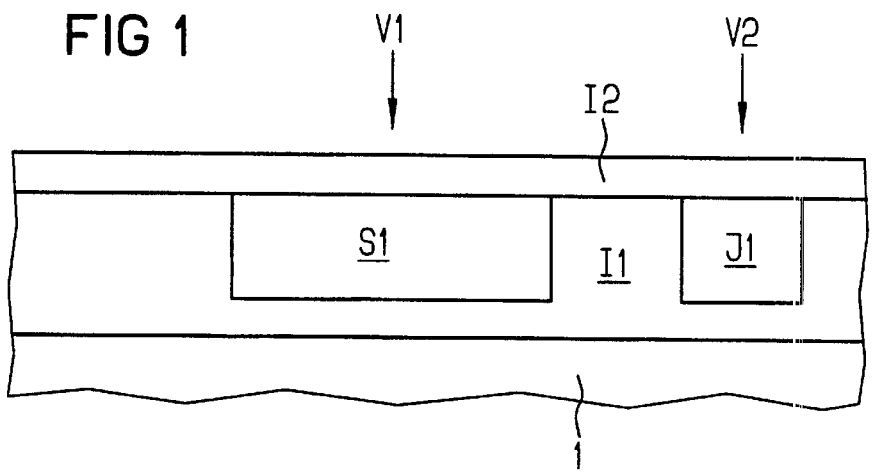
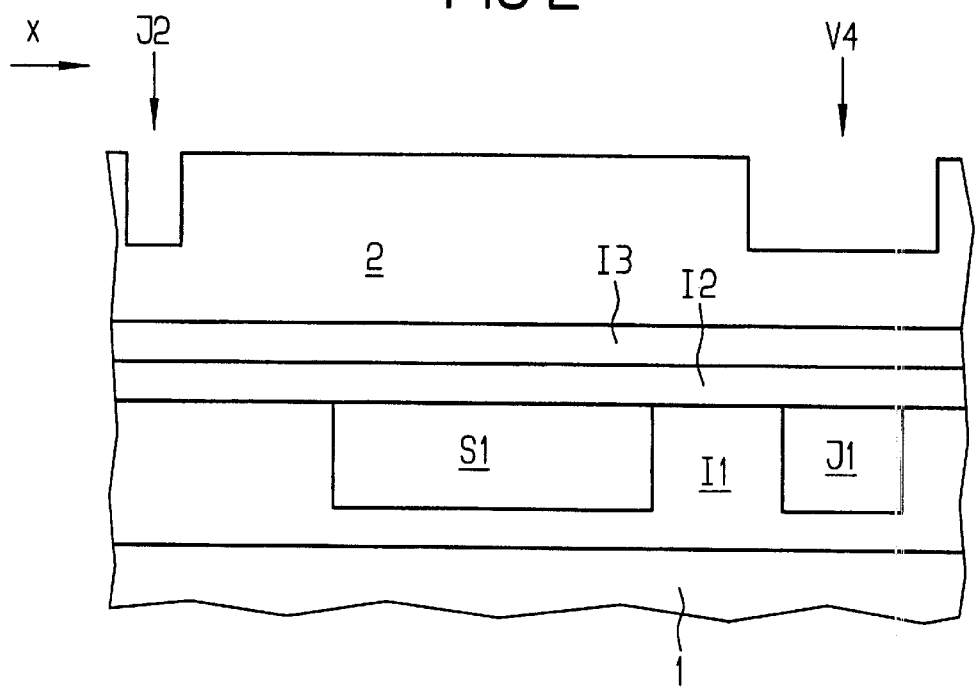

METHOD FOR FABRICATING AN INTEGRATED CIRCUIT CONFIGURATION

BACKGROUND OF THE INVENTION

FIELD OF THE INVENTION

The invention relates to a method for fabricating an integrated circuit configuration.

Endeavors are generally made to produce an integrated circuit configuration with an ever higher packing density.

A reference by Y. Hayashi et al., titled "Fabrication of Three-Dimensional IC Using Cumulatively Bonded IC (CUBIC) Technology", IEEE Symposium on VLSI Technology (1990), 95, describes a method for fabricating a three-dimensional integrated circuit configuration in which substrates containing semiconductor components are stacked one above the other. First, the semiconductor components are produced in the substrates. Each substrate is provided with a metalization plane that connects the semiconductor components of the substrate to one another. Tungsten pins are applied on each metalization plane. A first of the substrates is applied to a support substrate in such a way that its front side, on which the tungsten pins are disposed, adjoins the support substrate. A rear side of the first substrate is then thinned by grinding and provided with a further metalization plane. Depressions are produced in the rear side of the first substrate and their surfaces are provided with an Au—In alloy. A polymide layer is subsequently applied on the rear side of the first substrate. A second of the substrates is subsequently connected to the first substrate in such a way that the tungsten pins of the second substrate descend into the depressions on the rear side of the first substrate. The second substrate is aligned with respect to the first substrate with the aid of an infrared microscope. In order to connect the first substrate to the second substrate, the temperature is initially increased until the Au—In alloy melts. The temperature is then reduced to room temperature. The two substrates are pressed one on top of the other in the process. The support material is subsequently removed. The tungsten pins serve as contacts between the semiconductor components of the first substrate and the semiconductor components of the second substrate. The three-dimensional integration of substrates allows the integrated circuit configuration to have a particularly high packing density.

SUMMARY OF THE INVENTION

It is accordingly an object of the invention to provide a method for fabricating an integrated circuit configuration that overcomes the above-mentioned disadvantages of the prior art methods of this general, which can be a three-dimensional circuit configuration and can have a high packing density.

The problem is solved by a method for fabricating an integrated circuit configuration, in which at least one first structure of the circuit configuration is produced in the region of a surface of a first substrate. At least one alignment structure, which scatters electron beams differently than its surroundings, is produced in the region of the surface of the first substrate. A second substrate, which is more transmissive to electron beams than the alignment structure, is connected to the first substrate in such a way that the second substrate is disposed above the surface of the first substrate. In order to align at least one mask with respect to the first structure, the position of the alignment structure is determined with the aid of electron beams. With the aid of the mask, at least one second structure of the circuit configuration is produced in the region of an upper surface of the second substrate, the upper surface being remote from the first substrate.

The second structure is thus produced in such a way that it assumes a predetermined position with respect to the first structure.

In contrast to an integrated circuit configuration which is produced in a single substrate, the integrated circuit configuration according to the invention can have a particularly high packing density since the second structure and the first structure may be semiconductor components and, at the same time, may be disposed one above the other, with the result that the integrated circuit configuration is a three-dimensional circuit configuration. A projection of the first structure onto the surface of the first substrate and a projection of the second structure onto the surface of the first substrate can overlap. The projection of the second structure can even lie completely in the projection of the first structure.

In contrast to Hayashi et al. (see above), the second substrate does not have to be aligned with respect to the first substrate, since the second structure is produced only after the connection of the two substrates. The alignment of substrates is subject to greater alignment inaccuracies than the alignment of masks for producing structures. Consequently, the integrated circuit configuration can be produced with a higher packing density than the integrated circuit configuration according to Hayashi et al.

If a plurality of chips each containing a first structure analogous to the first structure and a second structure analogous to the second structure are produced from the two substrates, masks can be produced for each individual chip, with the result that the second structures can be aligned independently of one another with respect to the associated first structures in each case. In contrast to this, in the case of the method according to Hayashi et al. (see above), all the second structures have to be aligned jointly with respect to the first structures, with the result that it is not possible to compensate for differing distances between the second structures or between the first structures, and the alignment inaccuracies between a respective one of the first structures and the associated second structure are greater. For a compromise between the speed of the fabrication method and the reduction of alignment inaccuracies, it lies within the scope of the invention to produce a respective mask for groups of chips.

In contrast to Hayashi et al., a support substrate is not necessary. Consequently, the risky removal of the support substrate from a side of a substrate that encompasses semiconductor components is avoided.

The alignment of the mask with the aid of electron beams is very accurate in comparison with the alignment of the second substrate with the aid of infrared radiation as described in Hayashi et al. On account of insignificant alignment inaccuracies of the mask, the position of the second structure with respect to the first structure can be set very accurately. Consequently, the circuit configuration can be fabricated with a high packing density.

The search for the position of the alignment structure can be limited to a small part of the first substrate, since, as is customary in semiconductor fabrication, it is possible to carry out a prealignment with the aid of the shape of the first substrate. Consequently, in order to determine the position of the alignment structure, only a small region of the second substrate is irradiated by electron beams, with the result that most of the second substrate, in which the second structure is produced, is not jeopardized by possible damage due to the electron beams.

The alignment structure may be composed e.g. of metal or metal silicide. The first substrate and the second substrate may contain e.g. a semiconductor material such as silicon or germanium.

With the aid of a further mask, which is aligned e.g. like the mask, a contact hole, which is filled with conductive material in order to form a contact, can be produced in the second substrate. The second structure is electrically connected to the first structure via the contact.

On account of insignificant alignment inaccuracies of the further mask, the contact can have a subsequently smaller cross section than the tungsten pins described in Hayashi et al., with the result that the integrated circuit configuration can be fabricated with a higher packing density.

The contact hole uncovers the first structure, and the conductive material of the contact can be deposited directly on the first structure, with the result that the contact can have a good connection to the first structure with a low electrical resistance.

The first structure and the second structure may be e.g. semiconductor components, transistors, capacitors or lines.

The masks may be produced for example by electron beam lithography.

As an alternative, before the production of the second structure, with the aid of electron beam lithography, at least one further alignment structure is produced in the region of the upper surface of the second substrate, using which the mask and/or the further mask are aligned. In this case, the mask and/or the further mask and hence the second structure and/or the contact can be produced with the aid of optical lithography. The further alignment structure is produced at a defined distance, running parallel to the upper surface of the second structure, from a projection of the first structure onto the upper surface of the second substrate. In the case where only the further alignment structure is produced with the aid of electron beam lithography, a writing time of the electron beam is very short, and the process outlay for producing the integrated circuit configuration is thus small.

The further alignment structure contains, by way of example, at least one depression produced by electron beam lithography. During the production of the further alignment structure, the energy of the electron beam is preferably lower compared with the energy of the electron beam during the determination of the position of the alignment structure, with the result that the second substrate is not irradiated, and the electrons in the second substrate consequently cause fewer defects.

As an alternative, the first structure can be produced by a different technology than the second structure. By way of example, the first structure is produced with the aid of optical lithography and the second structure is produced with the aid of electron beam lithography.

In order to reduce fabrication costs, it is advantageous to produce sensitive semiconductor components in one of the two substrates and insensitive semiconductor components in the other of the two substrates. The substrate that encompasses the insensitive semiconductor components can be composed of an inexpensive material, without adversely affecting the quality of the integrated circuit configuration.

A first insulating layer may be produced on the surface of the first substrate, in which insulating layer the alignment structure and/or the first structure are produced, with the result that the alignment structure and/or the first structure do not adjoin the first substrate. This is expedient if the alignment structure and/or the first structure have to be electrically insulated from the first substrate. The first insulating layer may also act as a diffusion barrier if the alignment structure and/or the first structure contain a material, e.g. metal, which can easily diffuse into the substrate.

The invention makes it possible to produce a metallic structure, e.g. a line, before the production of semiconductor components, without the semiconductor components being contaminated by metal from the metallic structure. The metallic structure is produced as the first structure or as the alignment structure. It is completely encapsulated by the connection of the two substrates and by the first insulating layer and, consequently, does not cause any contamination. To ensure that the first structure does not contaminate the second substrate and is electrically isolated from the second substrate, it is advantageous to apply a second insulating layer above the first insulating layer after the production of the alignment structure and/or of the first structure. The alignment structure and/or the first structure are completely encapsulated by the first insulating layer and the second insulating layer.

The first structure may be produced e.g. as a metallic line. The second structure may be produced for example as a semiconductor component. In this case, the first substrate may contain an inexpensive material. At least one further semiconductor component, which is connected to the semiconductor component via the first structure, can be produced in the second substrate.

The semiconductor components may be e.g. transistors.

The integrated circuit configuration may be for example a memory cell configuration. The first structure is a bit line, for example. The semiconductor component and the further semiconductor component are for example MOS transistors of memory cells of the memory cell configuration. Capacitors may additionally be produced in the second substrate, the capacitors likewise being parts of the memory cells.

A memory cell is formed for example by one of the capacitors and one of the transistors. In this case, the memory cell configuration is a DRAM cell configuration.

The first structure may be produced as a storage node of a capacitor, and the second structure may be produced as a MOS transistor. The first structure and the second structure form a memory cell of the circuit configuration, which is a DRAM cell configuration. If the transistor is produced in a planar manner and if the storage node is disposed below the transistor, the capacitance of the capacitor is very large with, at the same time, a high packing density of the DRAM cell configuration.

The second substrate can be thinned by grinding after being connected to the first substrate, with the result that the contact is less deep. The second substrate can be thinned without difficulty and without damaging the semiconductor components, since the second structure is not actually produced before the connection of the first substrate to the second substrate. The first substrate serves as the support substrate.

In order to connect the first substrate to the second substrate, a third insulating layer may be applied on a lower surface, opposite to the upper surface, of the second substrate and planarized. The first substrate and the second substrate are joined together in such a way that the first insulating layer or, if provided, the second insulating layer adjoins the third insulating layer. The first insulating layer or the second insulating layer is permanently connected to the third insulating layer by a heat treatment step. This connection process is called "wafer bonding".

The second substrate may behave like a thick or like a thin silicon on insulator (SOI) substrate. Semiconductor components that are produced in such a second substrate may have a particularly high switching speed.

The connection may alternatively be effected by soldering metal layers that are applied on the first substrate and on the second substrate. In this case, the metal layers may act as electromagnetic shielding between the first substrate and the second substrate.

As an alternative, the first substrate is connected together with the second substrate using tungsten pins, as disclosed in Hayashi et al. It is not necessary to take account of alignment inaccuracies in this case, in contrast to Hayashi et al., since the second structure is produced only after the connection process.

It is possible to produce a plurality of structures in the first substrate and in the second substrate.

A plurality of metallic structures disposed one above the other may be provided in the first insulating layer. The metallic structures may be for example parts of different metalization planes.

Other features which are considered as characteristic for the invention are set forth in the appended claims.

Although the invention is illustrated and described herein as embodied in a method for fabricating an integrated circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, fragmented, sectional view through a first substrate after production of a first insulating layer, an alignment structure, a first structure and a second insulating layer according to the invention;

FIG. 2 is a fragmented, sectional view relating to FIG. 1 after a second substrate provided with a third insulating layer is connected to the first substrate and a further alignment structure is produced.

DESCRIPTION OF THE PREFERRED EMBODIMENTS

Figure 3:
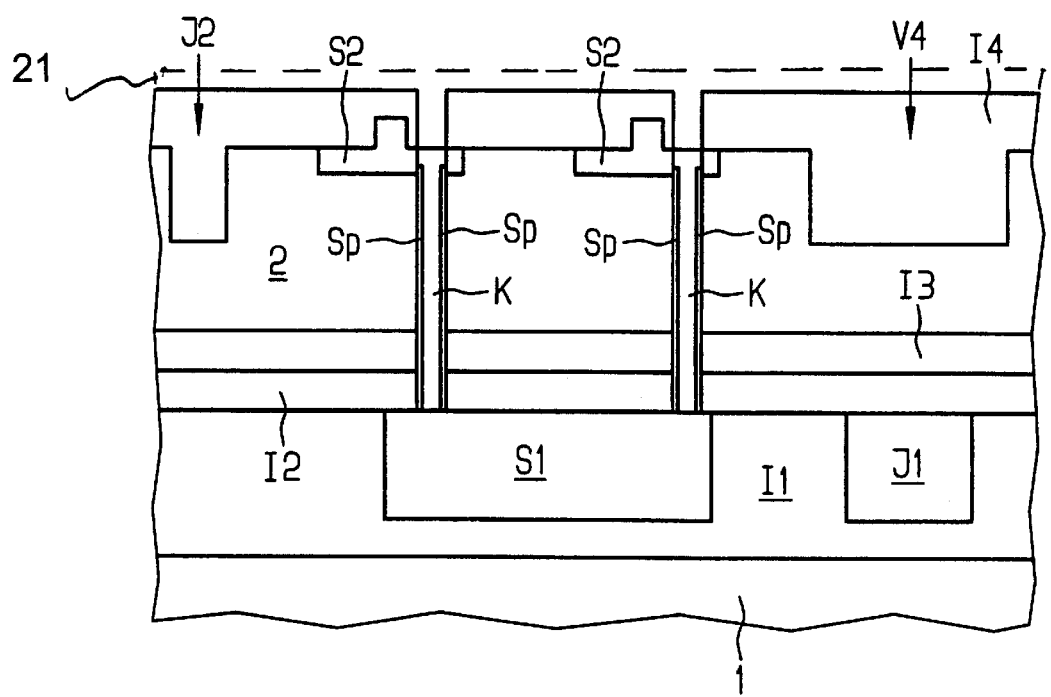
FIG. 3 is a fragmented, sectional view relating to FIG. 2 after the production of spacers, contacts and two second structures.

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment having a first substrate 1 which has a thickness of approximately 400 nm and is composed of silicon.

A first insulating layer I1 is produced on a surface of the first substrate 1 by $SiO_2$ being deposited to a thickness of approximately 1000 nm.

With the aid of a photoresist mask (not illustrated), a first depression V1 and a second depression V2 are produced, which depressions do not cut through the first insulating layer I1. To that end, $SiO_2$ is etched to a depth of approximately 600 nm using e.g. $CHF_3O_2$. The first depression V1 has a width of approximately 400 nm and a length of approximately 5 μm. The second depression V2 has a width of approximately 200 nm and forms an edge of an imaginary square with a lateral length of 3 μm. The first depression V1 and the second depression V2 are spaced apart from one another by approximately 50 μm.

The first depression V1 and the second depression V2 are filled with tungsten silicide by tungsten silicide being deposited to a thickness of approximately 100 nm and being planarized by chemical mechanical polishing. As a result, a metallic first structure S1 is produced in the first depression V1 and a metallic first alignment structure J1 is produced in the second depression V2.

In order to encapsulate the first structure S1 and the first alignment structure J1, a second insulating layer I2 is produced by $SiO_2$ being deposited to a thickness of approximately 100 nm.

A third insulating layer I3 is produced by $SiO_2$ being deposited to a thickness of approximately 100 nm on a lower surface of a second substrate 2 made of silicon. The second substrate having a thickness of approximately 100 μm.

The first substrate 1 is subsequently connected to the second substrate 2 by the substrates being joined together in such a way that the second insulating layer I2 and the third insulating layer I3 adjoin one another and are permanently connected to one another by being heated (see FIG. 2).

The second substrate 2 is subsequently processed by chemical mechanical polishing until the second substrate 2 has a thickness of approximately 1000 nm (see FIG. 2).

A first resist layer 20 (dashed lines) is applied on an upper surface of the second substrate 2, the surface being opposite to a lower surface of the second substrate 2. The position of the first alignment structure J1 is determined with the aid of electron beams. A first part of the resist layer 20 is exposed in the process. The energy of the electron beams is chosen such that the latter irradiate the second substrate 2.

After the position of the first alignment structure J1 has been determined, a further part of the resist layer 20 is irradiated with electrons. The further part of the resist layer 20 is at a defined distance from the first alignment structure J1. In the exemplary embodiment, the distance of the further part of the resist layer is approximately 10 μm along an x-axis x parallel to the surface of the first substrate 1. The energy of the electron beams is lower than the energy of the electron beams during the determination of the position of the first alignment structure J1, with the result that the electron beams do not irradiate the second substrate 2.

The irradiated parts of the resist layer 20 are subsequently removed. The patterned resist layer is used as a mask during the production of a third depression V3 and of a fourth depression V4. The third depression V3 forms a second alignment structure J2, which is disposed underneath the removed further part of the resist layer. The fourth depression V4 is disposed above the first alignment structure J1 and is a byproduct of the determination of the position of the first alignment structure J1.

By photolithographic methods with the aid of masks (not illustrated) which are aligned with respect to the second alignment structure J2, two second structures S2, which are MOS transistors, are produced on the upper surface of the second substrate 2 (see FIG. 3).

A fourth insulating layer I4 is subsequently produced by $SiO_2$ being deposited to a thickness of approximately 500 nm (see FIG. 3).

With the aid of a further mask 21 (dashed lines) which is aligned with respect to the second alignment structure J2, two contact holes are produced into the fourth insulating layer I4 and in the second substrate 2, which extend down to the first structure S1. The contact holes each cut through a source/drain region (not illustrated) of the MOS transistors (see FIG. 3).

Finally, $SiO_2$ is deposited to a thickness of approximately 40 nm and etched back to a depth of approximately 600 nm, with the result that sidewalls of the contact holes are provided with spacers Sp but the cut-through source/drain regions are not completely covered laterally by the spacers Sp (see FIG. 3).

In order to produce contacts K, tungsten silicide is deposited to a thickness of approximately 400 nm, planarized by chemical mechanical polishing and then etched back to a depth of 500 nm.

The contacts K connect the MOS transistors to the first structure S1. The first structure S1 consequently connects the MOS transistors to one another.

We claim:

1. A method for fabricating an integrated circuit configuration, which comprises:

providing a first substrate having a surface;

producing at least one first structure in a region of the surface of the first substrate;

producing at least one first alignment structure in the region of the surface of the first substrate, the at least one first alignment structure scatters electron beams differently than its surroundings;

applying a second substrate, being more transmissive to the electron beams than the at least one first alignment structure, above the surface of the first substrate;

determining a position of the at least one first alignment structure with an aid of the electron beams for assisting in aligning at least one mask with respect to the at least one first structure; and producing, with the aid of the at least one mask, at least one second structure in a region of an upper surface of the second substrate, the upper surface being remote from the first substrate.

2. The method according to claim 1, which comprises producing the at least one first structure as a metallic line.

3. The method according to claim 2, which comprises:

producing the at least one second structure as a semiconductor component; and producing at least one further semiconductor component in the second substrate such that the at least one first structure connects the further semiconductor component to the semiconductor component.

4. The method according to claim 1, which comprises:

using a further mask for producing a contact hole in the second substrate; and filling the contact hole with a conductive material for forming a contact, the at least one second structure is electrically connected to the at least one first structure via the contact.

5. The method according to claim 4, which comprises:

producing, before the producing step of the at least one second structure, at least one second alignment structure in the region of the upper surface of the second substrate with an aid of electron beam lithography, the at least one second alignment structure being used for aligning at least one of said at least one mask and said further mask; and producing said at least one second alignment structure at a defined distance, running parallel to the upper surface of the at least one second structure, from a projection of the at least one first alignment structure onto the upper surface of the second substrate.

6. The method according to claim 1, which comprises producing the at least one first structure with an aid of optical lithography.

7. The method according to claim 1, which comprises:

applying a first insulating layer on the surface of the first substrate; and producing at least one of the at least one first alignment structure and the at least one first structure in the first insulating layer such that at least one of the at least one first alignment structure and the at least one first structure do not adjoin the first substrate.

8. The method according to claim 7, which comprises:

applying and planarizing a second insulating layer above the at least one first structure;

applying and planarizing a third insulating layer on a lower surface, opposite to the upper surface, of the second substrate;

joining the first substrate and the second substrate such that the second insulating layer adjoins the third insulating layer; and heat treating the second insulating layer and the third insulating layer for permanently connecting the second insulating layer to the third insulating layer.

9. The method according to claim 8, which comprises thinning the second substrate by grinding after being connected to the first substrate and before the step of producing the at least one second structure.

10. The method according to claim 1, which comprises producing the at least one second structure with an aid of optical lithography.

* * * * *